United States Patent [19]
Ring

[11] 3,755,751

[45] Aug. 28, 1973

[54] HIGH VOLTAGE SOLID-STATE AMPLIFIER HAVING TEMPERATURE RESPONSIVE SHUTDOWN

[75] Inventor: Charles Martin Ring, Tempe, Ariz.

[73] Assignee: Motorola, Inc., Franklin Park, Ill.

[22] Filed: Oct. 21, 1971

[21] Appl. No.: 191,398

[52] U.S. Cl. ........................ 330/23, 330/13, 330/17, 330/207 P

[51] Int. Cl. ................................................ H03f 1/32

[58] Field of Search .................... 330/11, 207 P, 13, 330/17, 23, 38 M

[56] References Cited

UNITED STATES PATENTS

| | | | |
|---|---|---|---|
| 3,667,064 | 5/1972 | Thornton | 330/23 |
| 3,668,541 | 6/1972 | Pease | 330/23 |

*Primary Examiner*—Roy Lake
*Assistant Examiner*—Lawrence J. Dahl
*Attorney*—Foorman L. Mueller, Maurice J. Jones, Jr. et al.

[57] ABSTRACT

The amplifier circuit includes first and second output stages which respectively amplify positive and negative excursions of an input signal. A bias circuit connected to each stage prevents crossover distortion. A plurality of dependent current sources supplying the bias and amplifier stages are controlled by a master current source. Transistors having temperature responsive threshold voltages are thermally connected to each of the output stages and electrically connected between a constant bias supply and the master current source. If the temperature of either output stage increases above a predetermined value, the thermally associated transistor conducts and renders all of the current sources inoperative. Furthermore, diode strings are utilized to provide low base resistances and other transistors are utilized to provide high emitter resistances for selected transistors thereby enabling them to sustain high voltages.

26 Claims, 3 Drawing Figures

PATENTED AUG 28 1973 3,755,751

HIGH VOLTAGE SOLID-STATE AMPLIFIER HAVING TEMPERATURE RESPONSIVE SHUTDOWN

BACKGROUND OF THE INVENTION

It is sometimes desirable to provide electronic circuits in integrated form because of the resulting reductions in cost, size and weight; increase in reliability; and, in some cases, improvement in circuit performance. However, problems are encountered in monolithic power amplifiers which are due to physical limitations inherent in the transistors included therein. For instance, since the output transistors of power amplifier circuits must conduct high currents and absorb or sustain large voltages, they must be capable of dissipating large amounts of heat energy. If the thermal resistance between the base-to-collector junctions of transistors used in such applications and the ambient is too high to conduct the heat as it is generated, the temperature of the junction of the transistor increases. Assuming that the transistor is operated in its normal state with its collector-to-base junction reverse biased, the reverse current, $I_{CBO}$, between the collector-to-base junction increases with the increase in junction temperature. This increase in reverse current requires more power to be dissipated by the transistor which may further increase the junction temperature. Hence, a regeneration effect occurs which, if protective measures are not taken, may eventually increase the junction temperature until conduction is by intrinsic carriers thus resulting in a loss of transistor action. Finally, the temperature may rise to a point where it causes destruction of the transistor.

Another problem in monolithic power amplifier circuits occurs if large output voltage swings are required. Because of the lack of a high current PNP transistor in monolithic technology, NPN transistors are usually employed in power circuits. Low common-emitter breakdown voltages ($BV_{CEO}$) of approximately 30 volts in these NPN transistors result from difficulties in fabricating epitaxial collector materials with resistivities greater than 3 to 5 ohm centimeters. Furthermore, maximum current limits for the transistor and of the die surface interconnect metal and bonding wires must be observed or else these structures can be burned out resulting in an open circuit. Since it is impractical to repair integrated circuits, the failure of any of the components included therein as a result of any of the above phenomena generally means that the entire circuit must be discarded.

In the past, monolithic transistors have been connected in series in common emitter configurations so that they are able to sustain large power supply voltages which are necessary for large amplitude signal swings by dividing these voltages across them. Moreover, monolithic transistors have also been connected in parallel to handle large load currents which are divided between them. Some of these prior art configurations are unsatisfactory because they waste too much power, have low imput impedances, have high output impedances or cannot allow the output signal to substantially swing between the supply voltages. Furthermore, the plurality of transistors utilized in some prior art circuits tend to take up too much chip area.

SUMMARY OF THE INVENTION

An object of this invention is to provide an improved power amplifier circuit.

Another object is to provide a power amplifier with a temperature responsive circuit that prevents the temperatures of selected transistors in the amplifier from rising above predetermined maximum values.

Still another object is to provide a power amplifier circuit configuration which enables the transistors thereof to withstand voltages of large magnitudes without exhibiting undesirable breakdown.

A further object is to provide a class AB audio amplifier circuit which automatically limits the current through its load to a safe value and provides a high slew rate.

A still further object is to provide a high voltage, power amplifier circuit which is suitable for inexpensive manufacture in monolithic integrated circuit form and which can be employed in cooperation with a high voltage operational amplifier.

An additional object is to provide an improved high voltage amplifier circuit which includes a bias supply that provides substantially constant quiescent bias voltages even though power supplies having voltages anywhere within a predetermined range are connected thereto.

The high voltage amplifier circuit of one embodiment of the invention includes a first circuit portion for amplifying the positive excursions of a sinusoidal input signal and a second circuit portion for amplifying the negative excursions. An offset voltage for each of the amplifier portions is developed by a first bias circuit to prevent crossover distortion. Three dependent current sources respectively provide constant currents to: the first amplifier portion, the second amplifier portion, and the bias network provided that a master current control transistor included in a main current source is conductive. Temperature responsive transistors, thermally connected with each of the amplifier portions, each have emitter and collector electrodes connected across the base-to-emitter junction of the master current control transistor. A second bias circuit applies a constant bias voltage across the emitter-to-base junctions of each of the temperature responsive transistors which is insufficient to render either of them conductive so long as the temperature of the associated circuit portion is within a safe region. However, if the temperature of either of the circuit portions rises above a predetermined maximum value, the threshold voltage of the associated temperature responsive transistor drops below the bias potential and the transistor is rendered conductive thereby shutting down all of the current sources. The configuration of each of the circuit portions utilizes diode strings to provide the transistors included therein with little resistance in their base circuits as compared to relatively large amounts of resistance in their emitter circuits. This insures that the transistors can withstand high voltages developed between their electrodes. Furthermore, high voltage protection is achieved by similar provisions in the configuration of the thermal shutdown circuit. Also current limiting is provided in each of the output stages by the use of other diode strings which sense the voltage across resistors connected in the output current paths.

DETAILED DESCRIPTION

Figure 1:
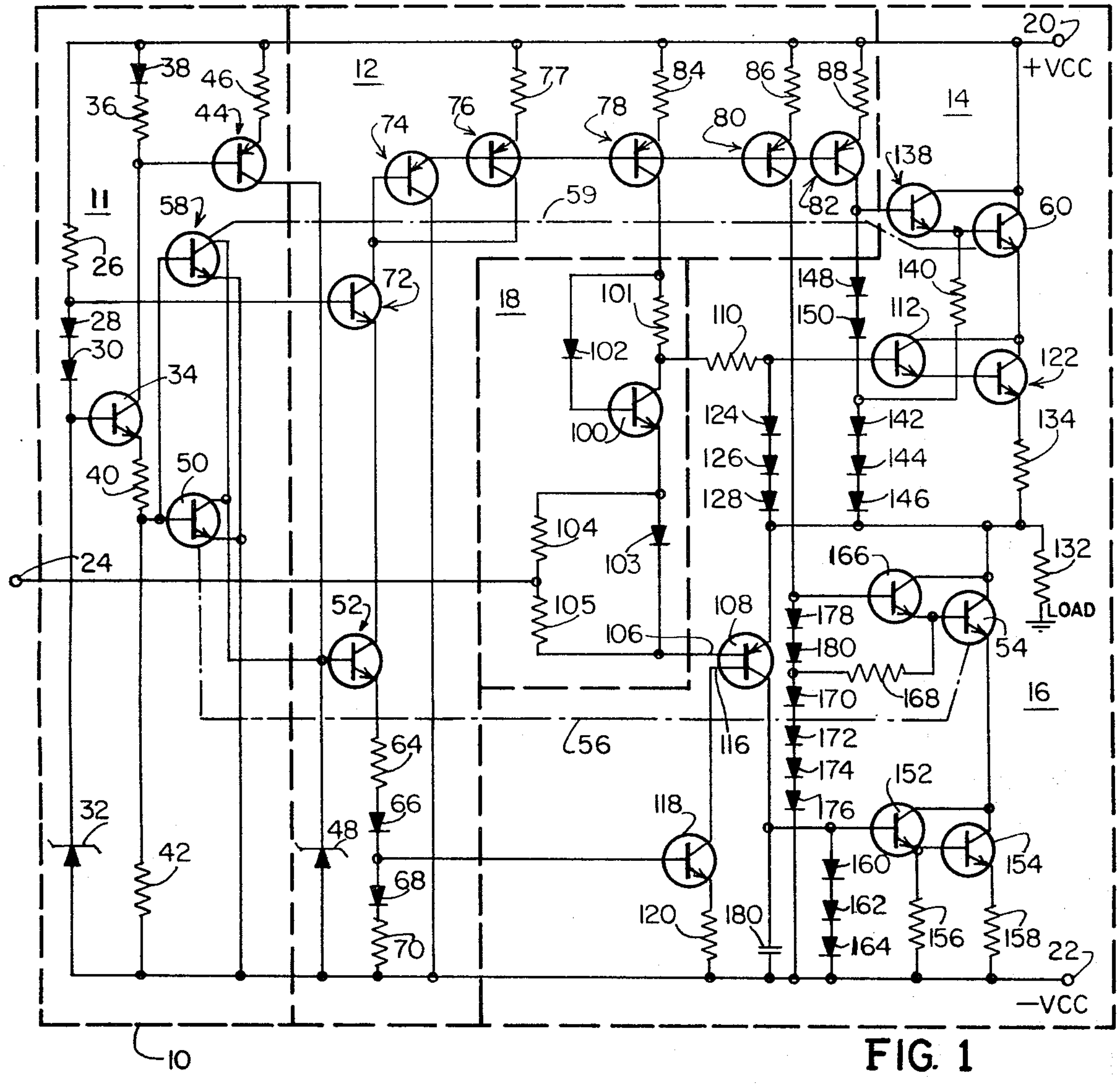
FIG. 1 is a schematic diagram of a high voltage, power amplifier circuit of one embodiment of the invention.

FIG. 1 is a schematic diagram of a high voltage power amplifier 10 of one embodiment of the invention which is marked off by dashed lines into a plurality of blocks. Although the configuration of amplifier 10 is described as being embodied in an independent, monolithic integrated circuit, it may also be employed either in discrete form or as part of an integrated circuit including other components. The general functional relationship between the blocks are first described, then the operation of each block is considered.

Block 11 includes a temperature responsive circuit which is arranged to shut down a master current source included in block 12 in response to the temperature of either of the output transistors of the amplifier formed by blocks 14 and 16 exceeding a predetermined maximum value. Block 18 includes a bias stabilizing circuit which applies a constant bias potential to the input transistors of the quasi complementary symmetry amplifier of blocks 14 and 16 even though the supply voltages applied to terminals 20 and 22 are subject to fluctuation or are equal to different values within predetermined ranges. Amplifier input terminal 24 is connected through bias stabilizing circuit 18 to the complementary amplifier circuit. Individual, dependent current sources in block 12 supply the complementary amplifier stages and the bias stabilization circuit. All of the blocks of the circuit cooperate to form a unity voltage gain power amplifier having an output which can swing approximately 70 volts and which has thermal and current limiting protection.

Block 11 includes a first series circuit comprised of resistor 26 diodes 28 and 30, and zener diode 32 connected between positive and negative power supply terminals 20 and 22. NPN transistor 34 has its base electrode connected to the junction between diode 30 and zener diode 32, its collector junction connected to the positive supply through resistor 36 and diode 38, and its emitter connected to the negative supply through a series circuit formed by resistors 40 and 42. PNP transistor 44 has its emitter electrode connected to the positive supply through resistor 46, its base connected to the junction between the collector of transistor 34 and resistor 36, and its collector connected to the negative supply through zener diode 48.

First temperature sensing or responsive transistor 50 has its base electrode connected to the junction between resistors 40 and 42, its emitter connected to the negative power supply and its collector connected to the base of master current source control transistor 52. Transistor 50 is located on the integrated circuit chip such that there is little thermal resistance between it and output transistor 54. This can be accomplished by locating transistor 50 near transistor 54 in the monolithic structure. The thermal conduction between transistor 50 and transistor 54 is indicated by dot-dash line 56 of FIG. 1. Second temperature responsive transistor 58 is connected in parallel with transistor 50, i.e., its base, emitter and collector electrodes are respectively connected to the base, emitter and collector electrodes of transistor 50. Furthermore, as indicated by dot-dash line 59, there is little thermal resistance between transistor 58 and transistor 60.

Referring now to block 12, master current source control transistor 52 has its emitter connected to the negative supply through a series circuit comprised of resistor 64, diodes 66 and 68, and resistor 70; and its collector is connected to the emitter of transistor 72. The base of transistor 72 is connected to the junction between resistor 26 and diode 28. The collector of transistor 72 is connected to the base of current regulating transistor 76. The emitter of transistor 74 is connected to the base of transistor 76 and the collector of transistor 74 is connected to the negative supply. Resistor 77 is connected from the emitter of transistor 76 to the positive supply. Transistors 44, 52, 72, 74 and 76 cooperate with their associated components to form the master current source.

Three individual current sources which are dependent on the master current source each include one of transistors 78, 80 and 82 which all have their bases connected to the base of transistor 76 and which respectively have their emitters connected through resistors 84, 86 and 88 to the positive supply. The collector of transistor 78 forms the output of a first current source which is connected to bias stabilization circuit 18, the collector of transistor 80 forms the output of a second current source which is connected to portion 16 of the output stage, and the collector of transistor 82 forms the output of the third current source which is connected to and provides a constant current for the amplifier portion of block 14.

In operation, current flows from the positive supply to the negative supply through the first series path including first zener diode 32 which develops a constant voltage at the base of transistor 34. Thus, a constant voltage is developed across the voltage divider comprised of resistors 40 and 42 that thereby establish a predetermined constant base-to-emitter bias voltage across resistor 42 which is carefully selected to insure that transistors 50 and 58 are nonconductive provided that the temperatures of transistors 54 and 60 which are respectively thermally connected thereto, are less than a maximum safe value. Resistor 40 may have a large value with respect to the value of resistor 42 so that even in view of the variations in the breakdown voltages provided by zener diodes 32 present in normal integrated circuit production runs, the voltage across resistor 42 remains essentially constant.

Since transistor 34 is biased in an ON or conductive state, it provides a path for a current flow through resistor 36 and diode 38 which provides an essentially constant bias voltage across the base-to-emitter of current source transistor 44 and resistor 46. Thus, transistor 44 operates as a constant current source for driving second zener diode 48 which in turn provides its breakover voltage to the base of transistor 52 provided that neither of temperature sensing transistors 50 or 58 is conductive.

Because the forward junction drops of diodes 28 and 30, and the breakover voltage of first zener diode 32 remain relatively constant even with supply voltage variations, the base-to-emitter voltage of transistor 72 likewise remains constant thus allowing it to pass a predetermined fixed value of current to the collector of transistor 52 which is virtually independent of any supply voltage magnitude greater than a few volts plus the zener voltage. Moreover, zener diode 48 provides a fixed voltage which is dropped across the base-to-emitter junction of transistor 52 and the series circuit formed by resistor 64, diodes 66 and 68, and resistor 70. Since the current through this series circuit between the emitter of transistor 52 and the negative supply is held constant by transistor 72, the voltage drop thereacross is constant thus causing a constant base-to-emitter voltage for master current control transistor 52.

The constant current coming into the collector of transistor 72 is comprised of a first constant component flowing from the base of transistor 74 and a second constant component flowing from the collector of transistor 76. Since the emitter current of transistor 76 is approximately equal to its collector current, a constant voltage is generated across resistor 77 and the base-to-emitter junction of transistor 76 which clamps the base-to-emitter voltages of dependent current source transistors 78, 80 and 82 to a constant value. If the emitter resistors 84, 86 and 88 all have values equal to resistor 77, the individual current sources including transistors 78, 80 and 82 will all deliver the same maximum amount of current to their associated loads, provided that both temperature sensing transistors 50 and 58 remain nonconductive so that master current control transistor 52 remains conductive.

As will be subsequently explained in greater detail, one of output transistors 54 and 60 must dissipate a large amount of electrical power when the voltage across the load has a high amplitude. These transistors dissipate electrical power by changing it into heat energy which increases the temperature of and eventually can destroy the collector-to-base junction. Assuming that the output transistors are made of silicon, the maximum junction temperature they can withstand is about 250°C. As the junction temperature of a transistor increases, the reverse current, $I_{CBO}$, flowing through the collector-to-base junction tends to increase which further increases the power dissipation required of the device. Hence, a thermally initiated regenerative affect occurs which, if left unchecked, could under high ambient or poor heat sinking conditions, result in the destruction of either or both of devices 54 and 60.

As the temperature of either output transistor 54 or 60 increases, the base-to-emitter threshold voltage of associated heat sensitive transistor 50 or 58 decreases approximately 2.4 millivolts per degree centigrade. Therefore, at some predetermined temperature, which might be on the order of 180°C, the constant bias voltage developed across resistor 42 will render either transistor 50 or 58 conductive thereby providing a lower resistance path to the negative supply for the current developed by the current source including transistor 44 than the resistance presented by zener 48. Accordingly, the base voltage of master current control transistor 52 will collapse, causing transistor 52 to be rendered nonconductive. As a result, the current source control voltage provided by the base-to-emitter junction of transistor 76 and across resistor 77 will also diminish to a point where none of the current sources including transistor 78, 80 and 82 will deliver current to their respective loads.

Once the junction temperature of the threatened output transistor decreases to a safe value, the threshold voltage of its associated temperature responsive transistor will increase to where it is above the constant voltage applied across resistor 42. The temperature responsive transistor 50 or 58 once again will become nonconductive and no longer provides a low impedance circuit across zener diode 48. In response, master current control transistor 52 will again be rendered conductive and the current sources including transistors 78, 80 and 82 will again provide currents to their respective loads.

For circuit 10 to provide large voltage swings across its load, the direct current supply voltages applied to terminals 20 and 22 must have large magnitudes. It can be seen from block 11 of the circuit of FIG. 1 that transistor 34 and transistor 44 must continuously withstand most of the supply voltages which are impressed across their collector-to-emitter or base terminals as circuit 10 operates. Thus, these junctions may undesirably break down if protective precautions are not taken.

Figures 2, 3:
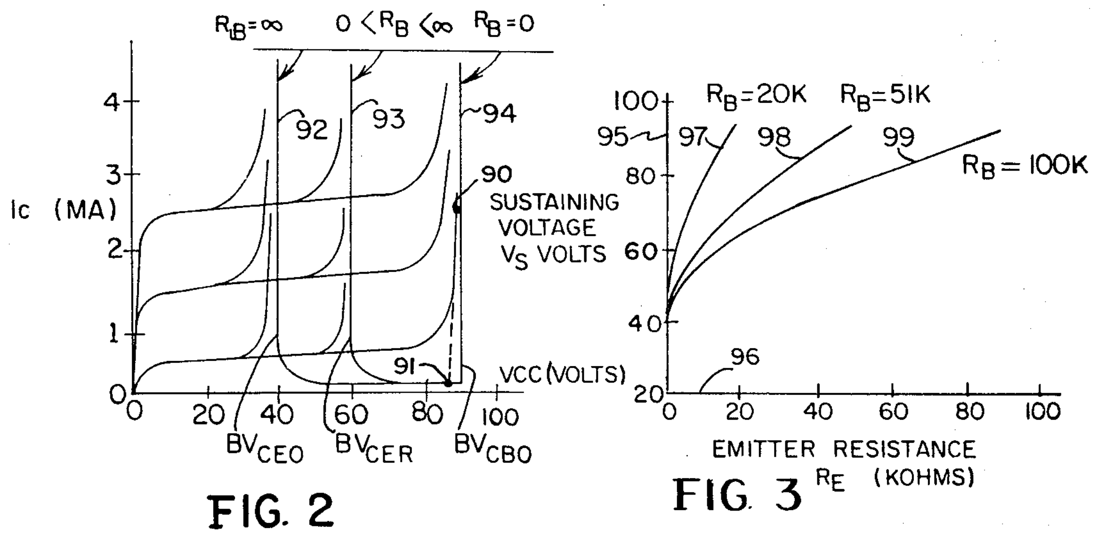
FIG. 2 shows the collector current versus collector voltage characteristics for a transistor with different values of base resistance and with its emitter resistance equal to zero.
FIG. 3 is a graph of transistor-sustaining voltage versus emitter resistance for various values of base resistance.

The detailed breakdown mechanism is not fully understood but is explained in terms of avalanche multiplication of the leakage current, $I_{CBO}$, in the collector-to-base junction. FIG. 2 shows a set of collector current, $I_C$, versus collector voltage, $V_C$, characteristics for a monolithic NPN transistor, e.g., any of transistors 44 and 50 or transistors 54 and 60. This breakdown phenomena is evidenced by a rapid increase, e.g., as shown at point 90, in reverse current when the reverse voltage, $BV_{CBO}$ reaches a critical value, e.g., as shown at point 91. It is believed that the critical value of voltage gives electrons in the semiconductor material enough energy to break additional valence bonds upon collision. This results in further generation of electron-hole pairs causing the reverse current, $I_{CBO}$, to multiply. The process eventually becomes so cumulative that an avalanche occurs and the junction "breaks down" completely.

If the base circuit of the transistor has a high resistance corresponding to curve 92, as compared to the emitter resistance, the leakage current tends to be beta multiplied within the transistor. The resulting exponential increase in current can cause the collector-to-base junction of the device to break down by the above described mechanism at the critical voltage $BV_{CED}$ which is less than $BV_{CBO}$. Alternatively, if the base circuit of the device presents a low resistance to the leakage current corresponding to curve 93, then the base circuit shunts the leakage current to ground increasing the sustaining voltage so that it approaches the collector-to-base breakdown voltage, $BV_{CBO}$. Thus, the amount of voltage which the transistor can withstand between its collector and emitter or base is greater with a low resistance in the base circuit than with a high resistance connected in the base circuit. In summary, when the emitter resistance is equal to zero ohms, breakdown voltage increases for a given device as the base resistance decreases, as shown by curves 92, 93 and 94.

Referring now to FIG. 3, breakdown or sustaining voltage measured along ordinate axis 95, is plotted as a function of emitter resistance, measured along abscissa 96, for different values of base resistance as depicted by curves 97, 98 and 99. Referring to any of these curves, e.g., curve 97, it can be seen that the breakdown voltage of the collector-to-base junction increases as the emitter resistance increases for any given value of base resistance.

Therefore, referring again to FIG. 1, emitter resistor 46 of transistor 44 can be chosen to have a relatively large value, e.g., on the order of 1.2 kilohms, as compared to the base resistance which includes resistor 36, e.g., which can be on the order of 500 ohms, and diode 38. Similarly, the emitter resistance of transistor 34, which is a function of the sum of resistors 40 and 42, can be chosen to have a high value, e.g., 8.4 kilohms as compared to the base resistance provided by zener diode 32. Thus the configuration of block 10 lends itself to circuit choices which greatly increase the breakdown or sustaining voltages of transistors 34 and 46 which are the only transistors included therein that are subjected to high voltages.

As previously mentioned, block 18, in response to current from the source including transistor 78, provides substantially constant bias potentials at its output even if different supply voltages are connected to the amplifier. These bias voltages prevent crossover distortion which would otherwise be caused by the thresholds of the input transistors of stages 14 and 16 and facilitate class AB operation. Furthermore, block 18 enables the circuit of FIG. 1 to present a high input impedance between input terminal 24 and the ground or reference potential. Included in block 18 is a transistor 100 having a collector electrode connected through resistor 101 to the collector of transistor 78, a base electrode connected through diode 102 to the collector of transistor 78 and an emitter electrode connected through diode 103 or resistors 104 and 105 to the first base 106 of field aided lateral PNP transistor 108.

In operation, current source 78 provides a current through diode 102 which produces a cathode-to-anode voltage which is divided between the collector-to-base junction of transistor 100 and resistor 101. This voltage in cooperation with the base-to-emitter voltage of transistor 100 and the junction drop provided by diode 103 tends to provide a selected amount of forward bias to transistor 112. Similarly, the voltage developed at the anode of diode 103 tends to forward bias the field aided lateral transistor 108 which allows current flow between its first gate 106 and second gate 116, which is connected to the collector of transistor 118.

The base of transistor 118 is connected to the junction between diodes 66 and 68, and the emitter of transistor 118 is conected through resistor 120 to the negative power supply. Since the voltage drop across diode 68 is virtually constant and since the constant current through resistor 70 provides a constant voltage thereacross, the base-to-emitter voltage of transistor 118 is also constant so that it sinks a desirable amount of current from the current source which includes transistor 78.

The portion of the output circuit responding to positive half cycles of a sinusoidal input signal applied to terminal 24 is included in block 14. A first control circuit is formed by transistors 112 and 122 which are connected in a Darlington configuration. The base electrode of transistor 112 is connected through a diode string comprised of diodes 124, 126 and 128 to end 130 of load 132 which has its other end connected to ground or reference potential. The emitter of transistor 122 is connected through current sensing resistor 134 to end 130 of load 132. The collector of transistor 122 is connected to the emitter of power transistor 60.

A first composite NPN power transistor is formed by transistor 138 and transistor 60 which are also connected in a modified Darlington configuration with their collectors tied to the positive supply. Resistor 140, in cooperation with a diode string comprised of diodes 142, 144 and 146 connects the emitter of transistor 138 and the base of transistor 60 to end 130 of load 132. Furthermore, diodes 148 and 150 form a series circuit between the collector of transistor 82 and the anode of diode 142.

In operation, a positive voltage applied to input terminal 24 causes the potential at the junction between resistors 104 and 105 to rise. The resulting rise in collector voltage of transistor 100 forward biases transistors 112 and 122. As a result, the voltage at the emitter of power transistor 60 drops which causes transistors 60 and 138 to conduct. As a result, current flows from the positive supply through transistors 60 and 122, resistor 134, and load 132. If the current through resistor 134 exceeds a predetermined amount because, fo, instance load 132 is shorted, the voltage thereacross will also exceed a predetermined level. In response, diodes 124, 126 and 128 will be rendered conductive thereby shunting the base current for transistor 112 to ground. Thus, the current through transistors 60 and 122 is limited to a safe value.

Diodes 148, 150, 142, 144 and 146 provide a low base resistance for transistor 138. Moreover, resistor 140, diodes 142, 144 and 146 provide a low base resistance for transistor 60; and diodes 124, 126 and 128 provide a low base resistance for transistor 112. Thus, the leakage current flowing through the collector-to-base junctions of transistors 60, 112 and 138 tends to be shunted through the load rather than multiplied by these transistors. As a result the breakdown voltages of transistors 60, 112 and 138 are increased by the mechanism illustrated in FIG. 2 with respect to what they would be if high base resistances were provided. Also, the Darlington circuit comprised of transistors 112 and 122, which are nonconductive when transistors 60 and 138 must sustain high voltages, forms a high emitter resistance for transistor 60. This high emitter resistance also tends to prevent the leakage current from flowing across the base-to-emitter junctions of transistors 60 and 138 and further tends to increase the breakdown voltages thereof by the mechanism illustrated in FIG. 3 with respect to what they would if low emitter resistances were provided. Thus, transistors 60, 112, 122 and 138 are protected against breakdown between their collector-to-base junctions.

Field aided lateral transistor 108 is utilized in block 16 which multiplies the negative excursion of the sinusoidal signal applied to input 24. Transistor 108 has a common emitter current gain, $h_{fe}$, and a common emitter current-gain-bandwidth, $f_t$, characteristics which are significantly higher than conventional lateral PNP transistors normally employed in monolithic integrated circuits. Two basic mechanisms are used to improve the performance of the transistor. Both result from an electric field which is set up in the base region by applying a biasing voltage between two $N^+$ contacts in the $N^-$ epitaxial or base layer located beyond the $P^-$ emitter and the $P^-$ collector diffusions. This field establishes a lateral voltage drop under the emitter which causes the bottom and remote edges of the emitter to be debiased. Hence, emission is only from the edge nearest the collector which prevents vertical diode action and also reduces the effective base width. In addition, the minority carriers are accelerated through the base width by drift action because of this field. Experimental results indicate that the field aided lateral transistor has a beta of about 20 more than that of a typical PNP lateral transistor and a bandwidth, $f_t$ of about twice that of a lateral PNP transistor commonly used in integrated circuits. Internal feedback within amplifier 10 balances the gains of stages 14 and 16.

The emitter of transistor 108 is connected to one end of load 132 and its collector is connected to the base of transistor 152. A composite PNP transistor or second electron control circuit is formed by transistors 108, 152 and 154. Transistors 152 and 154 are connected in a modified Darlington configuration and the collectors thereof are connected to the emitter of transistor 54. The emitter of transistor 152 is connected to the base of transistor 154 and through resistor 156 to the negative supply. Resistor 158 connects the emitter of transistor 154 to the negative power supply. The series diode string comprised of diodes 60, 162 and 164 connects the base of transistor 152 to te negative supply, and thereby provides a low base resistance which raises the sustaining voltage of transistor 152.

The collector of current source transistor 80 is connected to the base of transistor 166 which is connected in a modified Darlington configuration with transistor 54 to form a second composite power transistor. The base of transistor 54 is connected to the negative power supply through the series circuit formed by resistor 168 and diodes 170, 172, 174 and 176 which provides a low base resistance. Series connected diodes 178 ad 180 provide a low resistance path between the base of transistor 166 to the anode of diode 170. The collectors of transistors 54 and 166 are connected to end 130 of load 132.

In operation, a negative half cycle of a sinusoidal wave applied to input terminal 24 is conducted by resistor 105 of bias stabilization network 18 to base 106 of field aided transistor 108 which is rendered conductive between its emitter and collector electrodes. In response current flows up through load resistor 132, and transistor 108 into the base of transistor 152. The resulting voltage developed across emitter resistor 156 causes transistor 154 to be rendered conductive thereby bringing the potential at the collector of transistor 154 closer to the potential of the negative supply. As a result, transistors 54 and 166 are rendered conductive. Transistors 54 and 154 conduct most of the current passing through load resistor 132 in response to the negative excursions of the input signal.

In a manner similar to that described with respect to transistors 138, 60, 112 and 122, transistors 166, 54, 152 and 154 are protected against high collector-to-base voltages which result when the transistors of block 16 are nonconductive. More particularly, diodes 178, 180, 170, 172, 174 and 176 provide a low resistance base circuit for transistor 166 and resistor 168, diodes 170, 172, 174 and 176 provide a low resistance base circuit for transistor 54. The combination of transistors 152 and 154 provide a high resistance emitter circuit for transistor 54. Moreover, diodes 160, 162, and 164 provide a low resistance base circuit for transistor 152.

Furthermore, overcurrent protection is provided by resistor 158 which produces a voltage, if the current therethrough is excessive, which adds to the base-to-emitter drops of transistors 152 and 154 to forward bias diodes 160, 162 and 164 which shunts the base current of transistor 152 to the negative supply thereby limiting the current through stage 16. Resistor 110 and capacitor 180, which is connected from the base of transistor 152 to the negative supply, respectively, prevent circuit portions 14 and 16 from going into oscillation. Furthermore, resistors 134 and 158 provide negative feedback to respective transistors 122 and 154 which tends to compensate for changes in $I_{CBO}$ and the base-to-emitter voltages of transistor 122 and 154 with temperature change.

The configuration of high voltage power amplifier 10 provides a high slew rate because its current sources can be adjusted to provide sufficient current to the bases of the transistors in blocks 14 and 16 to enable the output voltage to have a short rise time in response to an input step function. Moreover, the Darlington configurations of the output transistors enables the amplifier to present a high input impedance and a low output impedance. Also, because of relatively few transistors being connected between each power supply terminal and the output terminal, the amplitude of the output voltage of the amplifier can substantially swing between the power supply potentials. More specifically, assuming that a power supply of plug 35 volts is connected to terminal 20 and power supply of minus 35 volts is connected to terminal 22, an output voltage swing of 65 volts can readily be attained.

What has been described, therefore, is a unique power amplifier circuit which is suitable for manufacture in integrated circuit form and operated between power supplies having high voltages. The circuit configuration enables transistors located in critical positions to have either low base circuit resistances or both low base circuit resistances and high emitter circuit resistances thereby increasing their base-to-collector breakdown voltages. Moreover, the amplifier includes thermal protection, current limiting and negative feedback to compensate for thermal affects. Many applications of this circuit will be apparent to those skilled in the art, e.g., it can be used as an audio power amplifier or as a high voltage power booster in cooperation with a high voltage operational amplifier.

I claim:

1. In an amplifier circuit having first electron control means connected to a current source, said first electron control means dissipating substantial amounts of electrical power in response to a drive current from the current source, which power dissipation tends to raise the temperature of the first electron control means above a predetermined value, the current source having control terminals, a protection circuit for limiting the temperature of said first electron control means to the predetermined value including in combination:

second electron control means having first, second and control electrodes which in response to a temperature sensitive threshold voltage between its first and control electrodes changes from a nonconductive state to a conductive state between its first and second electrodes, said threshold voltage decreasing with increasing temperature, and said first electron control means and said second electron control means being thermally coupled with each other to cause said second electron control means to have a temperature which increases with an increase in the temperature of said first electron control means;

first circuit means coupling said first and second electrodes of said second electron control means between the control terminals of the current source; and bias circuit means connected between and providing a constant bias voltage between said first and said control electrodes of said second electron control means which has a magnitude that is less than said threshold voltage which corresponds to temperatures of said first electron control means which are less than said predetermined temperature, said constant bias voltage causing said second electron control means to change from said nonconductive state to said conductive state in response to the predetermined temperature of the first electron control means to thereby render the current source inoperative before the temperature of the first electron control means exceeds the predetermined value.

2. The combination of claim 1 wherein the first and said second electron control means respectively are first and second transistors each having emitter, collector and base electrodes.

3. The combination of claim 2 wherein said bias circuit means includes:

power supply means providing a direct-current voltage of a first magnitude between first and second output terminals thereof;

zener diode means having a first terminal connected to said second output terminal of said power supply means and a second terminal, said zener diode means providing a resistance of a first magnitude between its first and second terminals;

second circuit means connecting said first power supply output terminal to said second terminal of said zener diode;

a third transistor having a base electrode connected to said second terminal of said zener diode, a collector-electrode coupled to said first power supply output terminal, and an emitter electrode, the collector-to-base breakdown voltage of the third transistor being about equal to said first magnitude;

first resistive means connected from said emitter electrode of said third transistor to said base electrode of said second transistor; and second resistive means connected from said base electrode of said second transistor to said second output terminal of said power supply means, said first resistive means having a relatively high magnitude as compared to said zener diode resistance of a first magnitude so that said third transistor can withstand said output voltage of the power supply means across its collector-to-emitter electrodes.

4. An amplifier circuit having a first electron control means which dissipates electrical power that tends to raise its temperature, the amplifier circuit including in combination:

a first current source with a second electron control means having first, second and control electrodes which allows current to flow through said first electron control means in response to a bias level between said first and control electrodes of said second electron control means;

first bias circuit means connected between said control and said first electrodes of said second electron control means for developing and applying said bias level therebetween;

third electron control means having first, second and control electrodes, said third electron control means being responsive to a temperature dependent threshold voltage between said first and control electrodes thereof to be rendered conductive between said first and second electrodes thereof, said first and second electrodes of said third electron control means being connected across said first bias circuit means;

heat conductive means thermally connecting the first electron control means to said third electron control means; and second bias circuit means connected between and providing a bias voltage of a fixed magnitude between said first and control electrodes of said third electron control means which is less than the threshold voltage corresponding to a predetermined temperature of the first electron control means, said threshold voltage of said third electron control means decreasing as the temperature of the first electron control means increases so that the threshold voltage of said third electron control means is reduced to said fixed magnitude of the bias voltage causing said third electron control means to be rendered conductive to remove said bias from said second electron control means and thereby rendering said first current source inoperative to protect the first electron control means.

5. The amplifier circuit of claim 4 wherein said first bias circuit means includes;

a zener diode connected to said control electrode of said second electron control means; and a second current source connected to said zener diode.

6. The amplifier circuit of claim 4 wherein said second bias circuit means includes:

power supply means providing a direct-current voltage between first and second output terminals;

zener diode means providing a first resistance between its anode and cathode, said anode being connected to said second output terminal of said power supply means;

first circuit means connecting said first power supply output terminal to said cathode of said zener diode means;

fourth electron control means having a first electrode, a control electrode connected to said cathode of said zener diode, and a second electrode coupled to said first power supply output terminal, said fourth electron control means requiring a relatively low resistance between its control electrode and said second power supply output terminal as compared to between its first electrode and said second output terminal to withstand said direct-current voltage across its first and second electrodes;

first resistive means having a second resistance connected from said first electrode of said fourth transistor means to said control electrode of said third electron control means; and second resistive means having a third resistance connected from said control electrode of said third electron control means to said second terminal of said power supply means, said second and third resistances having a sum of a relatively high value as compared to said first resistance of said zener diode means so that said fourth electron control means can withstand said direct-current voltage of the power supply means across its first and second electrodes.

7. The amplifier circuit of claim 6 wherein said second, third and fourth electron control means are transistors and said first, second and control electrodes respectively indicate the emitter, collector and base electrodes thereof.

8. The amplifier circuit of claim 6 wherein said first circuit means includes a series circuit formed by first and second diodes and a third resistive means.

9. A high voltage amplifier circuit for increasing the electrical power of signals applied to its input terminal, including in combination:

first circuit means for applying a supply voltage between supply and reference terminals thereof;

transistor means having first, second and control electrodes, said transistor means requiring a relatively low resistance from said control electrode to said reference terminal as compared to a high resistance between said first electrode and said reference terminal to sustain a predetermined supply voltage between said first and second electrodes;

conductive means connecting said second electrode to said supply terminal;

diode means connected from said control electrode to said reference terminal, said diode means being arranged to provide said relatively low resistance between said control electrode and said reference terminal; and second circuit means connecting said first electrode to said reference terminal.

10. The high voltage amplifier of claim 9 wherein said second circuit means includes electron control means connected between said first electrode and said reference terminal for providing said high resistance between said first electrode of said transistor means and said reference terminal.

11. The high voltage amplifier of claim 10 wherein said transistor means and said electron control means each include a pair of transistors connected in a Darlington configuration.

12. A high voltage amplifier circuit having a first input terminal and an output terminal which is connected to the first terminal of a load which also has a second terminal, the amplifier increasing the power of a first signal applied at the first input terminal and including in combination:

a current source providing a substantially constant current at its output terminal in response to a voltage applied to the bias terminal thereof;

first circuit means having a first terminal which is connected to said bias terminal of said current source and a reference terminal which is connected to the second load terminal, said first circuit means being adapted to apply a first supply voltage between said bias and reference terminals;

first electron control means having first, second and control terminals, said first terminal being coupled to the output terminal of the amplifier;

second circuit means coupling said control terminal to said output of said current source and to the first input terminal;

first transistor means having first, second and control electrodes, said first electrode being connected to said second terminal of said first electron control means, said control electrode being connected to said output of said current source, and said second electrode being connected to said first terminal of said first circuit means;

first diode means connected between said control electrode of said first transistor means and said amplifier output terminal; and said first electron control means providing a relatively high impedance at said first electrode of said first transistor means as compared to the low impedance provided by said first diode means at said control electrode of said first transistor means to enable said first transistor means to withstand high voltages between said first and second electrodes thereof.

13. The high voltage amplifier of claim 12 wherein said first electron control means includes:

first and second transistors each having emitter, base and collector electrodes, said emitter electrode of said first transistor being connected to said base electrode of said second transistor, said collector electrodes of said first and second transistors being connected together to form said second terminal, said base electrode of said first transistor forming said control terminal, and said emitter electrode of said second transistor forming said first terminal.

14. The high voltage amplifier of claim 13 further including:

first resistive means connected between said emitter electrode of said second transistor and said amplifier output terminal; and second diode means connected between said base electrode of said first transistor and said output terminal so that when the current through said first resistive means exceeds a predetermined amount, the voltage thereacross tends to forward bias said second diode means to thereby limit the current through said first transistor means and said first and second transistors.

15. The high voltage amplifier of claim 12 wherein:

said first transistor means includes third and fourth transistors each having emitter, base and collector electrodes;

said base electrode of said third transistor forming said control electrode, said collector electrodes of said third and fourth transistors being connected together to form said second electrode, and said emitter electrode of said fourth transistor forming said first electrode of said first transistor means;

said emitter electrode of said third transistor being connected to said base electrodes of said fourth transistor; and second resistive means connecting said base electrode of said fourth transistor to said first diode means.

16. The power amplifier of claim 12 wherein the first signal has a first polarity and said first supply voltage also has said first polarity with respect to the potential at said reference terminal of said first circuit means.

17. The high voltage amplifier circuit of claim 12 for also increasing the power of a second signal applied at a second input terminal further including in combination:

third circuit means adapted for applying a second supply voltage between first and reference output terminals, said reference output terminal being connected to the second terminal of the load;

second electron control means having first, second and control terminals, said first terminal being coupled to said first terminal of said third circuit means;

fourth circuit means coupling said control terminal of said second electron control means to the second input terminal;

second transistor means having first, second and control electrodes, said first electrode being connected to said second terminal of said second electron control means, said control electrode being connected to said output of said current source, and said second electrode being coupled to said output terminal of the amplifier;

third diode means connected between said control electrode of said second transistor means and said first terminal of said third circuit means; and said second electron control means providing a relatively high impedance at said first electrode of said second transistor means as compared to the low impedance provided by said third diode means at said control electrode of said second transistor means to enable said second transistor means to withstand voltages of high amplitude between its first and second electrodes.

18. The high voltage amplifier of claim 17 wherein said second electron control means includes:

fifth and sixth transistors each having emitter, base and collector electrodes, said emitter electrode of said fifth transistor being connected to said base electrode of said sixth transistor, said collector electrodes of said fifth and sixth transistors being connected together to form said second terminal of said second electron control means, said base electrode of said fifth transistor forming said control terminal and said emitter electrode of said sixth transistor forming said first terminal of said second electron control means.

19. The high voltage amplifier of claim 18 further including:

third resistive means connected between said emitter electrode of said sixth transistor and said first terminal of said third circuit means; and fourth diode means connected between said base electrode of said fifth transistor and said first terminal of said third circuit means so that when the current through said third resistive means exceeds a predetermined amount, the voltage thereacross tends to forward bias said fourth diode means to limit the current through said second transistor means and said fifth and sixth transistors.

20. The high voltage amplifier of claim 17 wherein:

said second transistor means includes seventh and eighth transistors each having emitter, base and collector electrodes;

said base electrode of said seventh transistor forming said control electrode, said collector electrodes of said seventh and eighth transistors being connected together to form said second electrode, and said emitter electrode of said eighth transistor forming said first electrode of said second transistor means;

said emitter electrode of said seventh transistor being connected to said base electrode of said eighth transistor; and fourth resistive means connecting said base electrode of said eighth transistor to said third diode means.

21. The high voltage amplifier circuit of claim 17 further including:

bias circuit means having first and second output terminals respectively connected to said first and second amplifier input terminals and a first bias terminal connected to said output of said current source, and a second bias terminal coupled to said first terminal of said third circuit means;

fifth circuit means connected between said first output terminal of said bias circuit and said first bias terminal for providing a bias voltage of said first polarity to said first electron control means; and sixth circuit means connected between said second bias terminal and said second output terminal for providing a bias voltage of said second polarity to said second electron control means.

22. The high voltage amplifier circuit of claim 17 wherein:

said current source includes first, second and third current source transistors each having emitter, base and collector electrodes;

fifth, sixth and seventh resistive means respectively connecting the emitter electrodes of said first, second and third current source transistors to said first terminal of said first circuit means;

seventh circuit means connecting the base electrodes of said first, second and third current source transistors together; and eighth circuit means respectively connecting said collector electrodes of said first, second and third current source transistors to form a plurality of output terminals for said current source.

23. The high voltage amplifier circuit of claim 22 further including:

a first current regulating transistor with emitter, collector and base electrodes, said base electrode of said first current regulating transistor being connected to said base electrodes of said first, second and third current source transistors;

eighth resistive means connecting said emitter electrode of said first current regulating transistor to said first terminal of said first circuit means;

a second current regulating transistor having its emitter electrode connected to said base electrode of said first current regulating transistor, its collector electrode connected to said first terminal of said third circuit means, and a base electrode connected to said collector electrode of said first current regulating transistor;

a master current control transistor having emitter, base and collector electrodes;

ninth circuit means connecting said collector electrode of said master current control transistor to said collector electrode of said first current regulating transistor;

tenth circuit means connecting said emitter electrode of said master current control transistor to said first electrode of said third circuit means; and first bias circuit means for applying a substantially constant voltage between the base-to-emitter of said master current control transistor so that said first, second and third current sources each generate said constant amounts of current.

24. The amplifier circuit of claim 23 wherein said first bias circuit means includes:

a zener diode connected to said base electrode of said master current control transistor; and a fourth current source connected to said zener diode.

25. The amplifier circuit of claim 23 further including:

third electron control means having first, second and control electrodes which is rendered conductive between its first and second electrodes in response to a temperature variable threshold voltage between its first and control electrodes;

eleventh circuit means coupling said first and second electrodes of said third electron control means respectively to said emitter and base electrodes of said master current control transistor;

heat conductive means thermally connecting said third electron control means and said first and second transistor means which causes said third electron control means to have a temperature that is a function of the temperature of said first and second transistor means;

second bias circuit means connected between and providing a constant bias voltage between said first and control electrodes of said third electron control means which has a magnitude that is less than the threshold voltage which corresponds to predetermined temperatures of said first and second transistor means, said threshold voltage of said third electron control means decreasing as the temperature of either the first or second transistor means increases, said third electron control means being rendered conductive by said threshold voltage becoming less than said constant bias voltage in response to the predetermined temperature thereby rendering said master current control transistor non-conductive before the temperature of either the first or second transistor means can exceed a maximum safe limit.

26. The amplifier of claim 25 wherein said third electron control means includes:

first and second control transistors each having emitter, base and collector electrodes;

said emitter, base and collector electrodes of said first control transistor being connected respectively to said emitter, base and collector electrodes of said second control transistor;

said first control transistor being located in close proximity to said first transistor means to sense the temperature thereof; and said second control transistor being located in close proximity to said second transistor means to sense the temperature thereof.

* * * * *